United States Patent [19]
Hashemi et al.

[11] Patent Number: 5,599,738
[45] Date of Patent: Feb. 4, 1997

[54] METHODS OF FABRICATION OF SUBMICRON FEATURES IN SEMICONDUCTOR DEVICES

[75] Inventors: Majid M. Hashemi; Saied N. Tehrani; Sung P. Pack, all of Tempe, Ariz.

[73] Assignee: Motorola, Schaumburg, Ill.

[21] Appl. No.: 566,385

[22] Filed: Dec. 11, 1995

[51] Int. Cl.⁶ .................................................. H01L 21/44
[52] U.S. Cl. .......................... 437/187; 437/175; 437/228; 216/77
[58] Field of Search ........................... 437/184, 228 SW, 437/228, 187, 186, 235, 245; 216/75, 77; 156/629.1

[56] References Cited

U.S. PATENT DOCUMENTS

| | | | |
|---|---|---|---|
| 4,354,896 | 10/1982 | Hunter et al. | 437/186 |
| 4,358,340 | 11/1982 | Fu | 437/245 |
| 4,432,132 | 2/1984 | Kinsbron et al. | 29/571 |
| 4,648,937 | 3/1987 | Ogura et al. | 437/245 |
| 4,689,869 | 9/1987 | Jambotkar et al. | 437/44 |

FOREIGN PATENT DOCUMENTS 0226930  9/1988  Japan ..................... 437/186

*Primary Examiner*—Trung Dang
*Attorney, Agent, or Firm*—Eugene A. Parsons

[57] ABSTRACT

A process of fabricating submicron features including depositing a gate metal layer on a substrate and forming a first etchable layer of material on the metal layer to define a first sidewall. A second etchable layer is deposited on the structure so as to define a second sidewall. The second etchable layer is etched so as to leave only the second sidewall and the first etchable layer is removed. The metal layer is etched using the second sidewall as an etch mask to form a submicron feature. The width of the feature depends upon the thickness of the metal layer.

19 Claims, 3 Drawing Sheets

METHODS OF FABRICATION OF SUBMICRON FEATURES IN SEMICONDUCTOR DEVICES

FIELD OF THE INVENTION

The present invention pertains to the fabrication of submicron features in semiconductor devices and more specifically to the fabrication of submicron semiconductor devices.

BACKGROUND OF THE INVENTION

In many semiconductor devices, such as field effect transistors (FETs), heterojunction field effect transistors (HFETs), and similar devices incorporating control terminals, the speed of the device and, hence the operating frequency, is at least partially determined by the control terminal area. That is, the smaller (narrower) the control terminal the higher the speed and operating frequency of the device.

In the prior art many attempts have been made to fabricate semiconductor devices with very small control terminals. The primary method of fabricating small control terminals in a semiconductor device is to utilize E-beam technology to draw the gate or control terminal in masking material, such as photoresist or other masking material. However, E-beam technology is extremely expensive and its through put is very small, making the manufacturing process very expensive and slow.

Some other methods have been suggested in the literature, including precise undercut etching or angle evaporation to define very small control terminals. However, these methods are very difficult to perform, involving many complicated process steps, and generally have low repeatability so that the devices fabricated are not reliable or consistent.

Accordingly, it is highly desirable to devise a fabrication process for submicron features in semiconductor devices which is simple, inexpensive and repeatable.

It is a purpose of the present invention to provide a new and improved method of fabricating submicron features in semiconductor devices.

It is another purpose of the present invention to provide a new and improved method of fabricating submicron features in semiconductor devices which is relatively inexpensive and simple to perform.

It is a further purpose of the present invention to provide a new and improved method of fabricating submicron features in semiconductor devices which is highly repeatable and provides highly reliable and consistent semiconductor devices.

SUMMARY OF THE INVENTION

The above problems and others are at least partially solved and the above purposes and others are realized in a process of fabricating submicron features including depositing a gate metal layer on a substrate and forming a first etchable layer of material on the metal layer to define a first sidewall. A second etchable layer is deposited on the structure so as to define a second sidewall. The second etchable layer is etched so as to leave only the second sidewall and the first etchable layer is removed. The metal layer is etched using the second sidewall as an etch mask to form a submicron feature. The width of the feature depends upon the thickness of the metal layer.

BRIEF DESCRIPTION OF THE DRAWINGS

Referring to the drawings.

DESCRIPTION OF THE PREFERRED EMBODIMENTS

Figure 1:
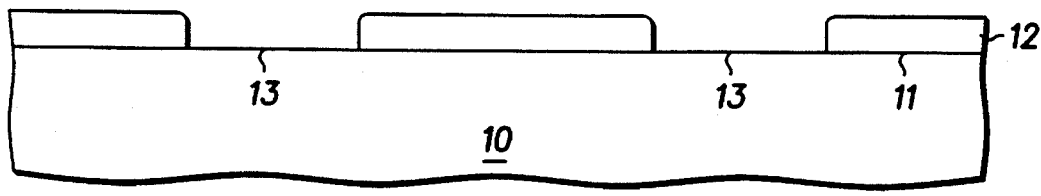
FIGS. 1–3 illustrate, in a simplified semi-schematic form, a first sequence of steps in a process of fabricating submicron features in a semiconductor device in accordance with the present invention.

Turning now to the drawings, wherein various steps in the fabrication of semiconductor devices with submicron features in accordance with the present invention are illustrated, FIG. 1 is a simplified semi-schematic drawing of a substrate 10 with a planar surface 11 and a discontinuity in the surface. In this specific embodiment the discontinuity is a patterned layer 12 of electrically conductive contact material, such as heavily doped gallium arsenide (GaAs), etc. Patterned layer 12 defines contact areas for electrodes of the semiconductor device which may be, for example, the current carrying electrodes (e.g. drain and/or source) for a FET, HFET, etc. It should be understood that in some applications or semiconductor devices a discontinuity may not be present and in some applications doping material may be introduced directly into substrate 10 to form the contact areas.

Patterned layer 12 is also patterned to define control electrode area or areas 13 therebetween. In the fabrication of FETs or HFETs this area is designed to receive a gate which, as described above, is desirably as small or narrow as possible. It should be understood that substrate 10 actually represents a semiconductor wafer, only a small portion of which is illustrated. Also, while patterned layer 12 includes three different discontinuities, various combinations of current carrying electrodes in various semiconductor devices are possible and, since such details are known in the art, they will not be elaborated upon in this disclosure.

Figure 2:
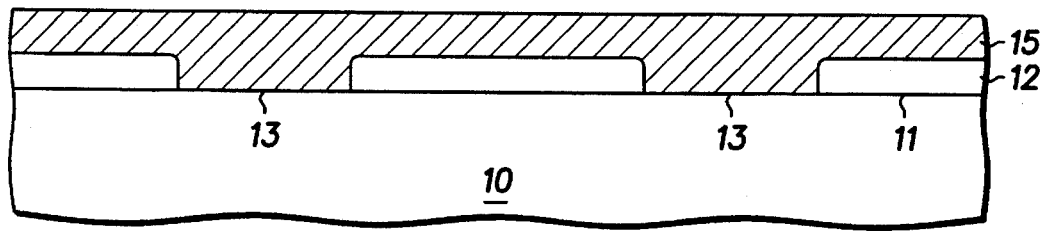
Figure 3:
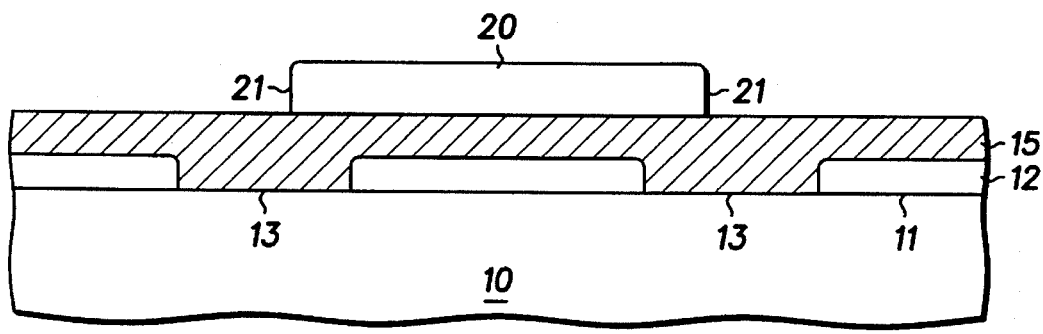

Referring now to FIG. 2, a layer 15 of gate metal (or other electrically conductive material) is deposited on substrate 10 so as to overlie control electrode areas 13 and the discontinuities in patterned layer 12. In this specific embodiment a blanket layer of gate metal, such as TiWN,Al, or similar metal capable of forming a good Schottky contact with the underlying material, is deposited onto the surface and substantially planarizes the structure. A first etchable layer 20 of material, which is generally a dielectric such as $Si_3N_4$ or the like, is deposited on the surface of layer 15 and patterned so as to present one or more sidewalls 21, as illustrated in FIG. 3.

Figure 4:
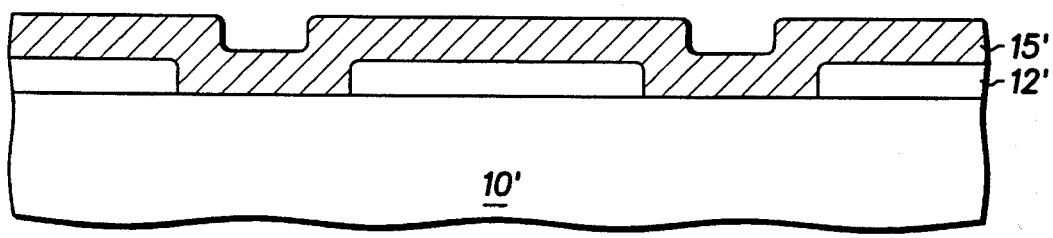
FIGS. 4 and 5 illustrate a slight modification in the steps depicted in FIGS. 1–3.
Figure 5:
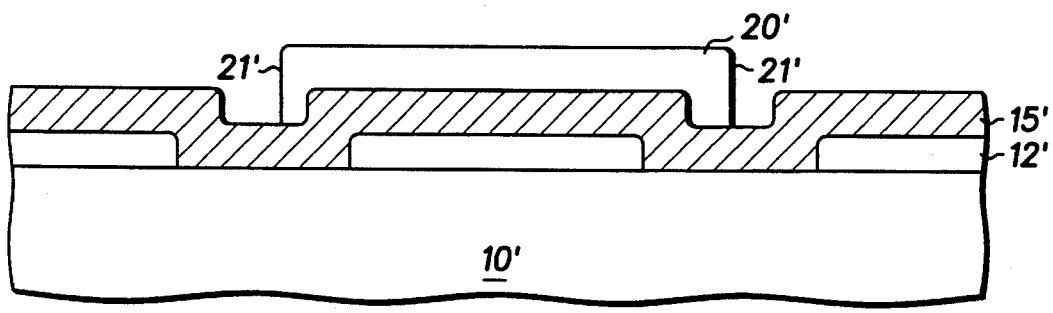

Turning, for a moment, to FIGS. 4 and 5 in which similar components are designated with similar numbers each having a prime added to denote a different embodiment, a slightly different embodiment is illustrated in which layer 15' is deposited conformally, so that discontinuities in layer 12' are preserved. It will of course be understood by those skilled in the art that during actual fabrication processes combinations of these two embodiments may be present and one purpose of illustrating the two possible extremes is to accentuate the fact that as long as layer 15' is thick enough to provide the desired result the surface contour is optional.

A first etchable layer 20' is deposited on the surface of layer 15' and patterned so as to present one or more sidewalls 21', as previously described.

Figure 6:
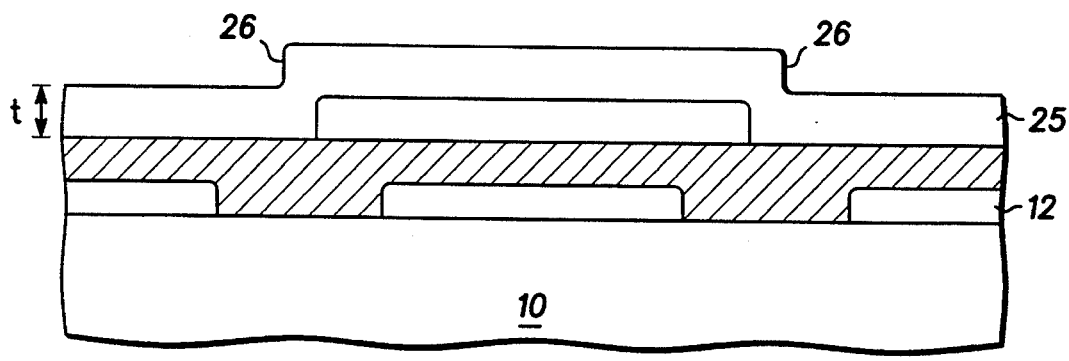
FIGS. 6–11 illustrate, in a simplified semi-schematic form, a final sequence of steps in the process of fabricating submicron features in a semiconductor device in accordance with the present invention.

Since the remainder of the process is similar in both embodiments, we will refer now to FIG. 6. A second etchable layer 25 is conformally deposited over layer 20 so as to define second sidewalls 26. It should be noted that second sidewalls 26 define a portion of layer 25 which is substantially thicker (approximately twice as thick) as the remainder of layer 25. Also, by correctly patterning layer 20 and sidewall 21, sidewall 26 (or the thicker portion of layer 25) is positioned at the desired location in control electrode area 13. Generally, layer 25 is formed of some easily etchable material, such as $SiO_2$ or the like, for reasons that will be apparent presently.

Figure 7:
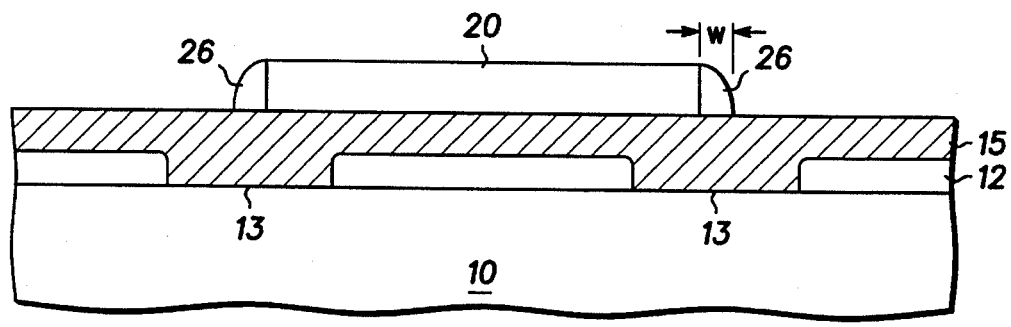

Referring now to FIG. 7, layer 25 is etched to remove everything except sidewall 26, or the thicker portion of layer 25. Here it should be noted that layer 25 has a thickness 't' and by etching 't' thickness of material from layer 25 sidewalls 26 are retained. Also, the width 'w' of sidewalls 26 is generally determined by the thickness 't' of layer 25. Thus, the width 'w' can be easily controlled by controlling the thickness 't' of layer 25, which is very accurately controllable.

Figure 8:
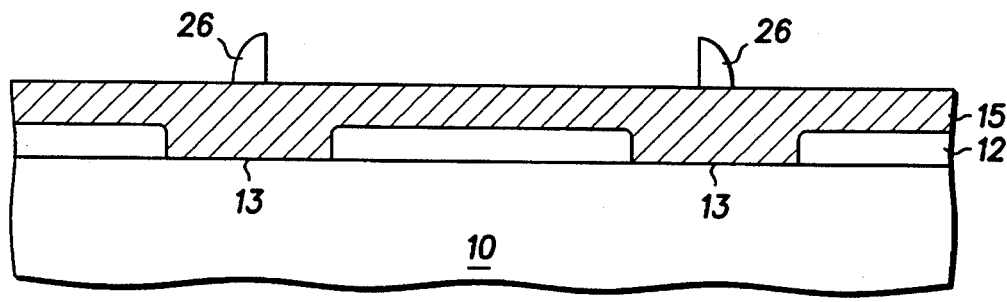
Figure 9:
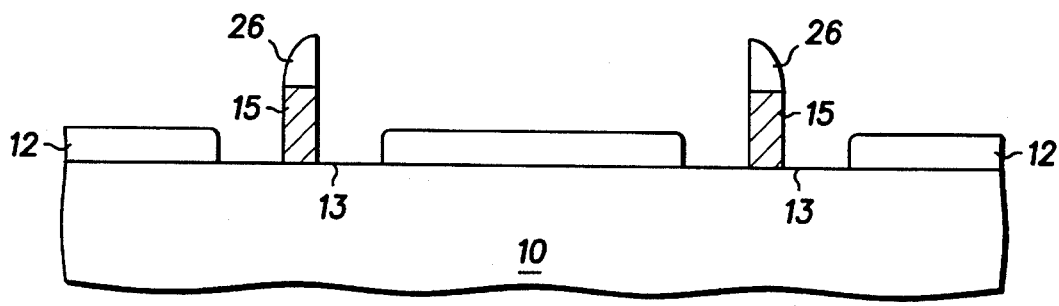
Figure 10:
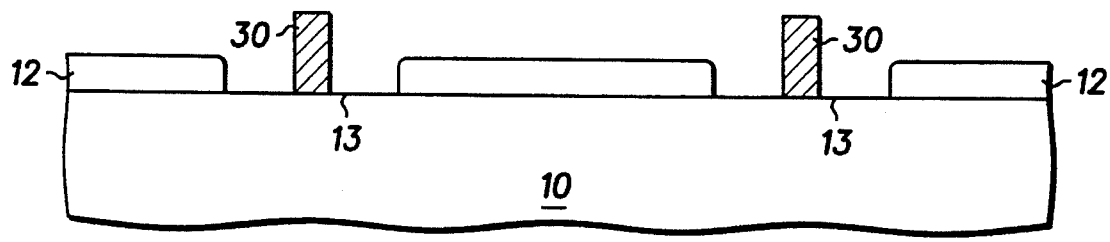
Figure 11:
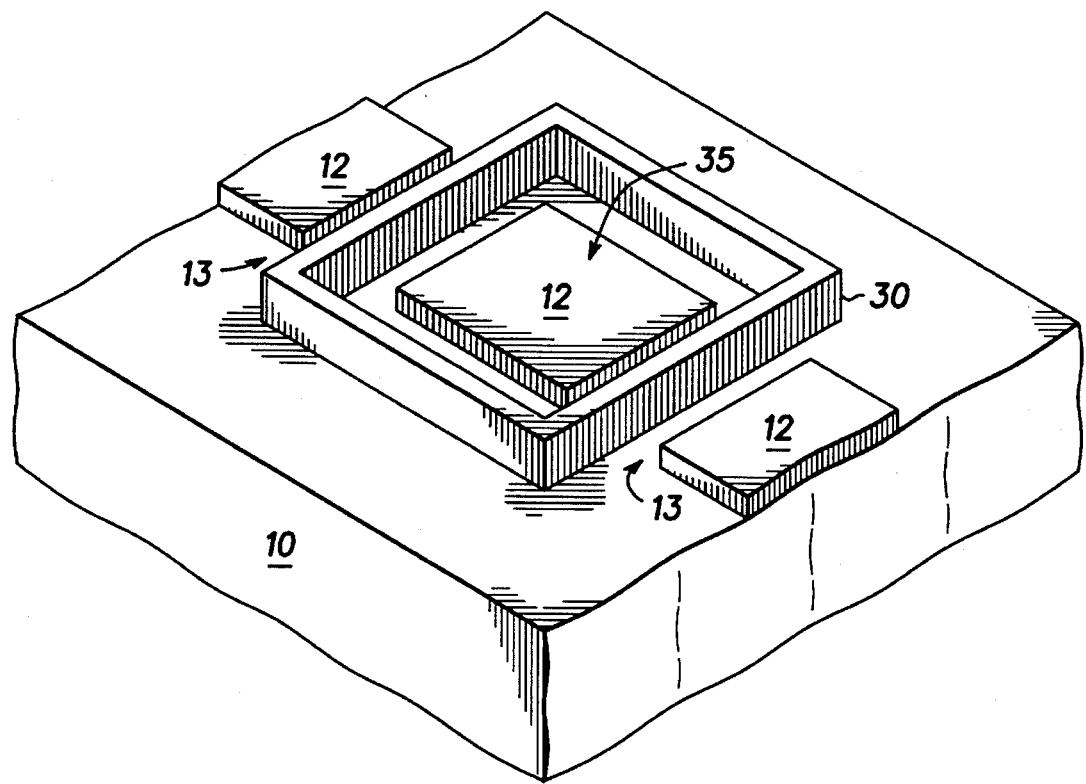

Layer 20 is now removed by any convenient method, such as a selective etch, to leave free standing sidewalls 26, as illustrated in FIG. 8. Layer 15 is then etched, using some convenient etch technique such as a reactive ion etch (RIE), and with sidewalls 26 acting as an etch mask, as illustrated in FIG. 9. The remaining portion or portions 30 of layer 15 define a control terminal (e.g. a gate for a FET or HFET) in control terminal area 13 for the semiconductor device. Portion 30 extends into and out of the paper in FIG. 10 and may be terminated to form two different portions or may be extended in the form of a rectangle, as illustrated in FIG. 11 to encircle an inner discontinuity 35. Once the etching of layer 25 is completed, sidewalls 26 can be removed to leave control terminals 30, as illustrated in FIGS. 10 or 11.

It should be noted that, because of the very accurate control possible on the thickness 't' of layer 25 and the very small thicknesses that can be achieved, portions 30 can be relatively easily fabricated in submicron sizes, for example 0.25 microns or less. Also, because the thickness of layer 25 is highly repeatable, portions 30 can be very accurately repeated over the entire wafer and over other wafers as well. Thus, semiconductor devices with submicron control electrodes are very manufacturable with very accurate and repeatable speed and frequency characteristics.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A process of fabricating a semiconductor structure with submicron features comprising the steps of:

providing a semiconductor structure with a planar surface and a discontinuity in the surface;

depositing an electrically conductive layer of material on the surface and the discontinuity of the semiconductor structure;

forming a first etchable layer of material on the electrically conductive layer so as to define a first sidewall adjacent the discontinuity of the semiconductor structure;

forming a second etchable layer of material on the electrically conductive layer and on the first etchable layer, the second etchable layer covering the sidewall in the first etchable layer and forming a second sidewall in the second etchable layer that is thicker than remaining portions of the second etchable layer;

etching the second etchable layer from the electrically conductive layer and the first etchable layer so as to leave a portion of the second sidewall in the second etchable layer;

removing the first etchable layer to leave the second sidewall in the second etchable layer spaced from the discontinuity of the semiconductor structure;

etching the electrically conductive layer of material on the surface and the discontinuity of the semiconductor structure using the second sidewall as an etch mask to form a submicron feature; and removing the second sidewall.

2. A process of fabricating a semiconductor structure with submicron features as claimed in claim 1 wherein the step of providing the semiconductor structure includes providing a substrate with a patterned layer of electrically conductive contact material on a surface thereof, the patterned layer defining electrodes of a semiconductor device.

3. A process of fabricating a semiconductor structure with submicron features as claimed in claim 2 wherein the step of providing the substrate with the patterned layer of electrically conductive contact material includes patterning the layer of electrically conductive material to define first and second current carrying electrodes on a surface of the electrically conductive contact material and a control electrode on a portion of the surface of the substrate therebetween.

4. A process of fabricating a semiconductor structure with submicron features as claimed in claim 1 wherein the step of depositing an electrically conductive layer of material includes depositing a layer of gate metal.

5. A process of fabricating a semiconductor structure with submicron features as claimed in claim 4 wherein the step of depositing the layer of gate metal includes depositing a layer of TiWN,Al.

6. A process of fabricating a semiconductor structure with submicron features as claimed in claim 1 wherein the step of forming the first etchable layer of material includes forming a layer of $Si_3N_4$.

7. A process of fabricating a semiconductor structure with submicron features as claimed in claim 1 wherein the step of forming the second etchable layer of material includes forming a layer of $SiO_2$.

8. A process of fabricating a semiconductor structure with submicron features as claimed in claim 1 wherein the step of etching the second etchable layer includes using a blanket reactive ion etch.

9. A process of fabricating a semiconductor structure with submicron features as claimed in claim 1 wherein the step of etching the electrically conductive layer of material includes using a blanket reactive ion etch.

10. A process of fabricating a semiconductor structure with submicron features as claimed in claim 1 including determining a width of the submicron feature during the step of forming the second etchable layer of material by forming the second etchable layer of material with a thickness adjusted to achieve the width.

11. A process of fabricating a semiconductor structure with submicron features comprising the steps of:

providing a semiconductor structure with an electrically conductive contact layer of material thereon;

etching the electrically conductive contact layer to expose a portion of the substrate, the exposed portion of the substrate defining a control electrode area and the electrically conductive contact layer defining a discontinuity adjacent to the control electrode area;

depositing a control electrode metal layer on the exposed portion of the substrate and the discontinuity of the semiconductor structure;

forming a first etchable layer of material on the control electrode metal layer overlying the discontinuity of the semiconductor structure so as to define a first sidewall adjacent the discontinuity of the semiconductor structure;

forming a second etchable layer of material on the control electrode metal layer and on the first etchable layer, the second etchable layer covering the sidewall in the first etchable layer and forming a second sidewall in the second etchable layer that is thicker than remaining portions of the second etchable layer and that is spaced from the discontinuity of the semiconductor structure;

etching the second etchable layer from the control electrode metal layer and the first etchable layer so as to leave a portion of the second sidewall;

removing the first etchable layer to leave the second sidewall spaced from the discontinuity of the semiconductor structure;

etching the control electrode metal layer of material on the surface and the discontinuity of the semiconductor structure using the second sidewall as an etch mask to form a submicron control electrode; and removing the second sidewall.

12. A process of fabricating a semiconductor structure with submicron features as claimed in claim 11 including determining a width of the submicron feature during the step of forming the second etchable layer of material by forming the second etchable layer of material with a thickness adjusted to achieve the width.

13. A process of fabricating a semiconductor structure with submicron features as claimed in claim 11 wherein the step of providing the semiconductor structure with the electrically conductive contact layer of material thereon includes providing a GaAs substrate with a patterned layer of heavily doped GaAs on a surface thereof, the patterned layer defining electrodes of a semiconductor device.

14. A process of fabricating a semiconductor structure with submicron features as claimed in claim 13 wherein the step of providing a GaAs substrate with a patterned layer of heavily doped GaAs on a surface thereof includes patterning the layer of heavily doped GaAs to define first and second current carrying electrodes for an HFET and a control electrode on a portion of the surface of the substrate therebetween.

15. A process of fabricating a semiconductor structure with submicron features as claimed in claim 11 wherein the step of depositing the control electrode metal layer includes depositing a layer of TiWN,Al.

16. A process of fabricating a semiconductor structure with submicron features as claimed in claim 11 wherein the step of forming the first etchable layer of material includes forming a layer of $Si_3N_4$.

17. A process of fabricating a semiconductor structure with submicron features as claimed in claim 11 wherein the step of forming the second etchable layer of material includes forming a layer of $SiO_2$.

18. A process of fabricating a semiconductor structure with submicron features as claimed in claim 11 wherein the step of etching the second etchable layer includes using a blanket reactive ion etch.

19. A process of fabricating a semiconductor structure with submicron features as claimed in claim 11 wherein the step of etching the electrically conductive layer of material includes using a blanket reactive ion etch.

* * * * *